United States Patent
Moosburger et al.

(10) Patent No.: US 9,885,738 B2
(45) Date of Patent: Feb. 6, 2018

(54) CIRCUIT ASSEMBLY FOR THE STATE MONITORING AND LOGGING OF OVERVOLTAGE PROTECTION DEVICES OR OVERVOLTAGE PROTECTION SYSTEMS

(71) Applicant: DEHN + SÖHNE GMBH + CO. KG, Neumarkt (DE)

(72) Inventors: Benjamin Moosburger, Seubersdorf (DE); Peter Igl, Pyrbaum (DE); Thomas Boehm, Hohenfels (DE); Hans Herold, Berching (DE)

(73) Assignee: Dehn + Söhne GmbH + Co. KG, Neumarkt (DE)

( * ) Notice: Subject to any disclaimer, the term of this patent is extended or adjusted under 35 U.S.C. 154(b) by 550 days.

(21) Appl. No.: 14/382,595

(22) PCT Filed: Mar. 5, 2013

(86) PCT No.: PCT/EP2013/054377
§ 371 (c)(1),
(2) Date: Sep. 3, 2014

(87) PCT Pub. No.: WO2013/131897
PCT Pub. Date: Sep. 12, 2013

(65) Prior Publication Data
US 2015/0015243 A1    Jan. 15, 2015

(30) Foreign Application Priority Data
Mar. 7, 2012    (DE) .................... 10 2012 004 716

(51) Int. Cl.
*G01R 1/07*    (2006.01)
*G01R 19/00*    (2006.01)
(Continued)

(52) U.S. Cl.
CPC ........... *G01R 19/0092* (2013.01); *G01R 1/07* (2013.01); *G01R 1/203* (2013.01); *G01R 1/206* (2013.01);
(Continued)

(58) Field of Classification Search
CPC .... G01R 31/14; G01R 31/2829; G01R 1/206; G01R 1/203; G01L 1/2287;
(Continued)

(56) References Cited

U.S. PATENT DOCUMENTS

| 6,104,590 A | 8/2000 | Schmidt ........................ 361/118 |
| 2006/0082942 A1 | 4/2006 | McCollough, Jr. .......... 361/93.1 |

(Continued)

FOREIGN PATENT DOCUMENTS

| DE | 3 823 389 | 8/1989 | ............. G01R 15/20 |
| DE | 10 2004 006987 | 8/2005 | ............... H01T 1/12 |

(Continued)

OTHER PUBLICATIONS

International Search Report (in English) dated Jul. 1, 2013, the Written Opinion of the International Searching Authority (in English), dated Sep. 7, 2014, and the International Preliminary Report on Patentability (in English) dated Sep. 9, 2014 issued by the World Intellectual Property Organization (WIPO) for Applicants' corresponding PCT Application No. PCT/EP2013/054377, filed on Mar. 5, 2013.

*Primary Examiner* — Melissa Koval
*Assistant Examiner* — Trung Nguyen
(74) *Attorney, Agent, or Firm* — Bodner & O'Rourke, LLP; Gerald T. Bodner; Christian P. Bodner

(57) ABSTRACT

The invention relates to a circuit assembly for the state monitoring and logging of overvoltage protection devices or overvoltage protection systems by means of pulse current monitoring, comprising at least one passive RFID transpon-
(Continued)

der having an inductively coupled voltage supply, wherein in the case of an event of the overvoltage protection device or the overvoltage protection system, the RFID transponder antenna circuit is influenced, in particular interrupted, short circuited, or detuned, so that disturbance processes can be identified. According to the invention, a coil L2 is provided on a discharge line of the overvoltage protection device or the overvoltage protection system that carries pulse currents that occur, which coil is oriented in such a way that the field caused by pulse current passes through the coil winding surface, wherein the coil L2 is connected to at least one switching device, which is connected on the antenna circuit of the RFID transponder to the inductor L1 there in order to influence the antenna circuit at least at times.

10 Claims, 2 Drawing Sheets

(51) Int. Cl.
| | | |
|---|---|---|
| *H02H 9/04* | (2006.01) | |
| *G01R 1/20* | (2006.01) | |
| *G01R 1/36* | (2006.01) | |
| *G06K 19/07* | (2006.01) | |
| *H02H 3/04* | (2006.01) | |

(52) U.S. Cl.
CPC .............. *G01R 1/36* (2013.01); *H02H 3/046* (2013.01); *H02H 9/042* (2013.01); *G06K 19/0716* (2013.01); *H02H 3/048* (2013.01)

(58) Field of Classification Search
CPC .............. H01L 51/0048; H01L 39/126; G06K 19/0716; H02H 3/048; H02H 3/046
USPC ....... 324/633, 636, 600, 652, 675, 668, 682, 324/500, 555, 76.11, 126, 127
See application file for complete search history.

(56) References Cited

U.S. PATENT DOCUMENTS

| | | | | |
|---|---|---|---|---|
| 2009/0002175 | A1* | 1/2009 | Waters | G06K 19/0726 340/572.5 |
| 2011/0026179 | A1 | 2/2011 | Kasper | 361/91.5 |
| 2011/0102957 | A1 | 5/2011 | Kasper | 361/91.5 |
| 2014/0176164 | A1* | 6/2014 | Davis | A46B 9/028 324/709 |

FOREIGN PATENT DOCUMENTS

| | | | |
|---|---|---|---|
| DE | 10 2006 018471 | 10/2007 | .............. B60M 1/12 |
| DE | 10 2008 016585 | 10/2009 | ........... G01R 19/165 |
| DE | 10 2008 016589 | 10/2009 | .............. H02H 3/04 |
| DE | 10 2008 025501 | 12/2009 | .............. H02H 9/06 |
| EP | 0 350 662 | 1/1990 | ............. G01R 15/20 |
| EP | 0 463 860 | 1/1992 | ........... G01R 19/165 |
| EP | 0 915 345 | 5/1999 | ............. G01R 15/26 |
| WO | WO 2011/058318 | 5/2011 | .............. H02H 9/04 |

* cited by examiner

CIRCUIT ASSEMBLY FOR THE STATE MONITORING AND LOGGING OF OVERVOLTAGE PROTECTION DEVICES OR OVERVOLTAGE PROTECTION SYSTEMS

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

(1) Field of the Invention

The invention relates to a circuit arrangement for the status check and logging of overvoltage protection devices or overvoltage protection systems by means of monitoring pulsed currents, comprising at least one passive RFID transponder having an inductively coupled voltage supply, wherein, in the event case of the overvoltage protection device or the overvoltage protection system, the RFID transponder antenna circuit is influenced, in particular interrupted, short-circuited or detuned so that interfering events are identifiable, according to patent claim 1.

(2) Description of Related Art

A sensor arrangement is known from WO 2011/058318 A1, which registers fast transient current loads in overvoltage protection devices and stores the number of current pulses in an evaluation unit. The number of the registered pulses is used to evaluate the status of the overvoltage protection device.

In the measurement unit according to DE 10 2008 016 585 A1 the voltage curve of an overvoltage protection device is identified and evaluated by means of a diagnosis unit. The functional state of the protection device is classified on the basis of the features of the voltage curve, such as amplitude, gradient, voltage value range and time. If the features do not meet predetermined criteria, the protection device is identified as being not functionally operative.

A repetition of the status control in predetermined periods is taught in DE 10 2008 016 589 A1. The functionally inoperative protection element is deactivated, and a switchover to a spare element takes place. The error condition is signaled by an indicating device or a detector.

DE 10 2008 025 501 A1 discloses an indicating device, configured as a fuse, which is connected into a discharge path of an overvoltage protection device. The circuit branch is disconnected when the fuse is triggered, while a second discharge path connected in parallel remains functionally operative.

For detecting impulse currents in conductors and overvoltage protection devices a solution is already known from DE 38 23 389 C1, according to which the magnetic field generated by the impulse current changes, in particular deletes, data that are stored on a magnetizable data carrier. The intensity of the current event can then be indirectly determined from the data that have remained on the data carrier.

The generic DE 10 2004 006 987 B3 discloses an arrangement for the status check and logging of overvoltage protection devices, in particular for the use thereof in low-voltage networks or information technology.

According to this solution an overvoltage protection device is structurally combined with a fault detection unit in a housing, wherein the fault detection unit can be read out and interrogated using an RFID transponder located in the housing.

The transponder described in this document, which represents the actual data carrier of the RFID system, is usually formed of a coupling element and a microchip. Being a passive transponder no own energy supply is provided. The whole energy for operating the passive transponder is withdrawn from the electric or magnetic field of the reading device. In a fault event of the overvoltage protection device according to DE 10 2004 006 987 B3, with the RFID transponder being configured as a passive transponder with an inductively coupled voltage supply and an available identification circuit having a memory function, which contains production-specific and application-specific information as well as test data and characteristic data, the fault detection unit is induced to short-circuit or interrupt the transponder antenna circuit. Alternatively, it is possible to selectively modify the resonant circuit frequency by switching on or off antenna coil windings or resonant circuit capacitors. The status check arrangement is interrogated using a hand-held reading device. Data stored in the transponder memory chip are read out and, depending on the result of the status check, an exchange of the respective overvoltage protection device may be carried out.

There are cases of application, however, in which a status check and the logging of overvoltage protection devices or overvoltage protection systems is desired, but a selective overload of the antenna circuit of the RFID transponder module, respectively, of another relevant transponder input by the impulse current flow is not possible. This is the case, for instance, if the RFID antenna coil surface is too small, if the antenna is not optimally oriented relative to the field lines of the interfering magnetic field, or if the impulse currents to be monitored are too low, i.e. their energy is insufficient.

BRIEF SUMMARY OF THE INVENTION

Based on the foregoing it is, therefore, the object of the invention to provide a further developed circuit arrangement for the status check and logging of overvoltage protection devices or overvoltage protection systems by means of monitoring pulsed currents, which is based on a passive RFID transponder having an inductively coupled voltage supply, wherein, in the event case of the overvoltage protection device or the overvoltage protection system, the RFID transponder antenna circuit is influenced to identify interfering events. According to the object the influencing of the transponder antenna circuit is to be possible irrespective of the characteristics of the respective RFID coil. At the same time, it is to be considered that the transponder modules available on the market usually have a higher electric strength at their inputs.

The solution to the object of the invention is achieved by a circuit arrangement according to the feature combination of patent claim 1. The dependent claims represent at least useful embodiments and further developments.

According to the invention, there is provided a reversible or irreversible switch, respectively, a corresponding switching device triggered by a magnetic field of the pulsed current, which influences, in particular interrupts, the RFID antenna circuit.

In one embodiment of the invention, it is possible to carry out an evaluation of the present pulsed currents, respectively, impulse currents by providing several parallel switching devices which are supplied with a distributed release current by connecting respective resistors upstream thereof. Each switching device is assigned an own RFID circuit, the RFID circuits being successively addressed and checked by an evaluation unit as to whether the data stored in the respective transponder can be read. From this information the evaluation unit can then identify triggered threshold switches, i.e. activated switching devices, and obtain an information about the occurring impulse current quantity or an impulse current quantity that has occurred.

If the switching device is configured as an electronic switch, e.g. a self-conducting MOSFET, it is possible to interrupt the RFID antenna circuit only for a certain time. If the transponder is continuously interrogated by a corresponding evaluation unit a counting device for the occurrence of interference pulses may be realized. To this end, it has to be ensured that the evaluation unit is operated with an interrogation interval that is smaller than the time constant of the electronic switch.

Accordingly, the object of the invention is based on a circuit arrangement for the status check and logging of overvoltage protection devices or overvoltage protection systems by means of monitoring pulsed currents, wherein the circuit arrangement comprises at least one passive RFID transponder having an inductively coupled voltage supply. In the event case of the overvoltage protection device or the overvoltage protection system the RFID transponder circuit is influenced, in particular interrupted, short-circuited or detuned so that interfering events are identifiable.

According to the invention, a down conductor of the overvoltage protection device or the overvoltage protection system, which carries occurring pulsed currents, is provided with a coil which is oriented such that the field induced by the pulsed currents penetrates the winding surface of the coil, wherein the coil is in communication with at least one switching device which is connected to the antenna circuit of the RFID transponder with the inductor provided there so as to influence the antenna circuit at least temporarily. The aforementioned coil works entirely independently of the actual antenna circuit coil of the transponder and can be optimized for the intended purposes.

The inductor of the coil forming the antenna circuit of the RFID transponder has an orientation which ensures that there is no induction or only little induction when pulsed currents occur.

In a preferred embodiment the pulsed current coil is connected to a Graetz rectifier bridge which is connected, on the output side, by a diode to the switching element, respectively, switching device, wherein the switching element keeps the antenna circuit of the RFID transponder, comprising the antenna circuit coil and a capacitor provided there, closed in the initial state.

If the switching element is triggered, a half-wave of the voltage generated by the coil of the antenna circuit is blocked by the rectifier bridge and the aforementioned diode, so that the sensitivity of the RFID communication is influenced, in particular reduced.

The pulsed current coil is preferably configured as a toroidal core coil or as an air-cored coil, in particular a Rogowski coil.

In another embodiment of the invention several diodes are provided on the output side of the Graetz rectifier bridge, each of which lead via a resistor to an associated switching element, wherein minimum triggering levels for the associated switching elements can be predefined based on the values of the resistors. Thus, an evaluation of occurring pulsed currents or impulse currents is possible. To this end, each of the switching elements is in communication with an own RFID transponder and the respective antenna circuit thereof.

In the embodiments mentioned first, the switching elements may be configured as fuses.

If transistors, in particular MOSFETs, are used as switching elements it is possible to influence, in particular interrupt, the RFID antenna circuit only for a predetermined time. After a time constant, which can be set, the antenna circuit is closed again and transferred to the normal operating condition. This measure allows the realization of a counting device for the occurrence of pulses, e.g. in order to register a discharge current in an air-termination device of a lightning protection system.

If the switching device is triggered it is possible to build up a communication connection by an increased coupling between a transponder reading device and the antenna circuit so as to read out the information stored in the transponder. The coupling can be enhanced, for instance, by an increased transmitting power, with the aim of obtaining a data transmission between the transponder and the reading device.

The invention will be explained in more detail below by means of exemplary embodiments and with the aid of figures.

BRIEF DESCRIPTION OF THE SEVERAL VIEWS OF THE DRAWINGS(S)

Figure 3:
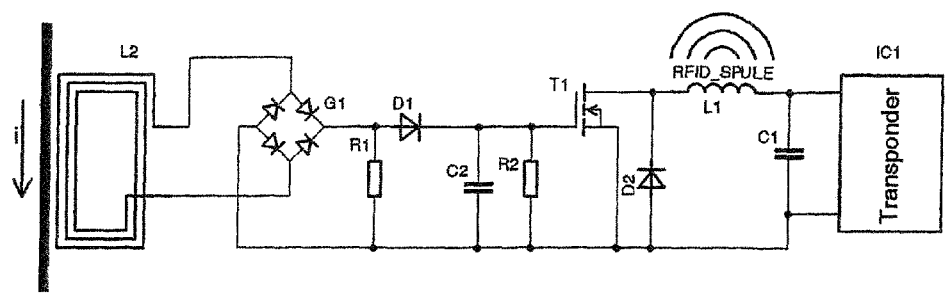
Figure 4:
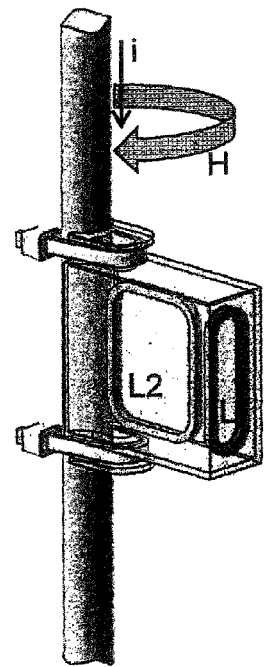

FIG. 3 shows a schematic circuit arrangement including an electronic switch as the switching device, by means of which the RFID antenna circuit can be interrupted for a certain time so as to realize a counting device for the occurrence of pulses, and FIG. 4 an exemplary arrangement of the inventive pulsed current coil and the RFID antenna circuit coil on an air-termination device for the monitoring of same.

DETAILED DESCRIPTION OF THE INVENTION

Figure 1:
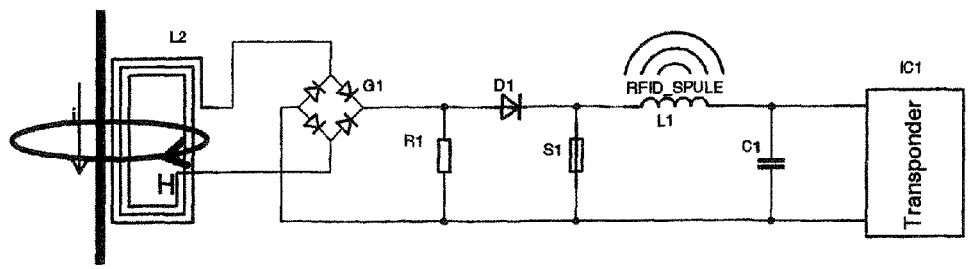
FIG. 1 shows a schematic circuit diagram of a first embodiment of the solution according to the invention for the status check and logging of overvoltage protection devices, having a fuse as switching element or switching device.
Figure 2:
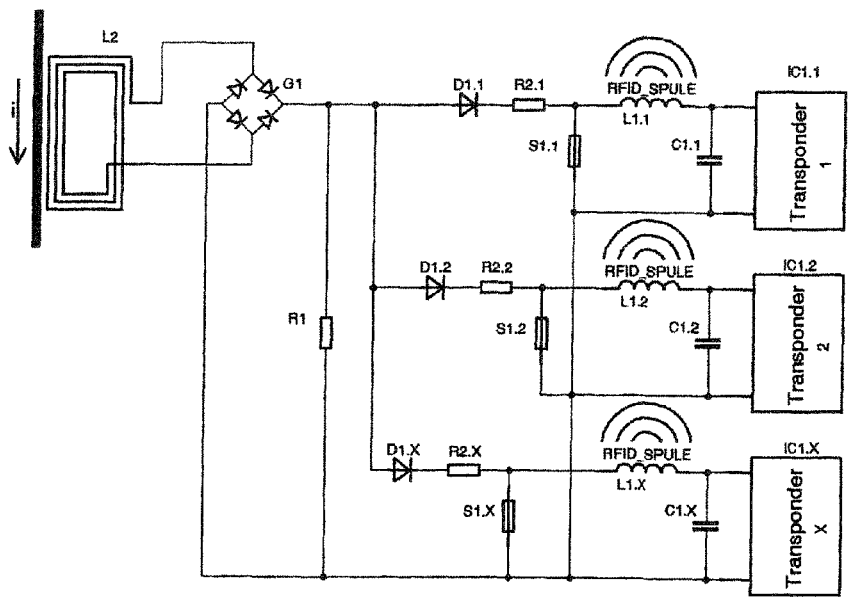
FIG. 2 shows a schematic circuit arrangement of the solution according to the invention, in which energy generated by coil L2 is divided to several switching devices, in particular fuses, for the easier evaluation of the impulse current having occurred in the conductor.

As illustrated in FIGS. 1, 2 and 3, the pulsed current i flowing through a down conductor generates an induction voltage in a coil L2 arranged on or near the down conductor.

Via a Graetz rectifier bridge G1 and a diode D1 connected in the forward direction, this induction voltage is applied to a switching device configured as fuse S1.

If the energy applied to coil L2 is higher than the melting integral of the fuse S1, the fuse is triggered.

The fuse S1 is unloaded in the initial state. Thus, the antenna circuit, formed by the RFID coil L1 and the RFID capacitor C1, the latter establishing the RFID transmission with the transponder IC1, is closed.

If S1 is triggered, a half-wave of the voltage generated by the RFID coil L1 is blocked by the rectifier bridge G1 and the diode D1.

As a consequence, the sensitivity of the transmission channel to a (non-illustrated) reading station is reduced. If the coupling between the reading device and the transponder circuit is reduced, the transmission is switched off when the fuse S1 opens.

By an enhanced coupling, e.g. increase of the transmitting power of the reading device, a communication to the transponder, respectively, reading device can be reestablished although the fuse S1 is interrupted. The advantage of this is that the information stored in the transponder can still be read out even though the monitoring of the pulsed current is activated.

In one embodiment a toroidal core may be used for the coil L2 so as to increase the sensitivity for the pulsed current detection. The toroidal core may also be hinged or configured with a mobile leg, as is known in connection with so-called current probes. Equally suited is an air-cored coil, in particular a Rogowski coil, to realize the inductor L2 as user-friendly as possible.

An exemplary dimensioning for monitoring the discharge current in overvoltage protection devices is based on an RFID coil L1 with L=7.4 mH and N=480 windings.

The coil L2 has, for instance, an inductance L=1.1 pH with N=12 windings on the toroidal core.

A Schurter MAG FF, 200 mA is used as a fuse.

The above-described dimensioning results in a triggering of the fuse at a pulsed current 8/20 µs at a level of approximately 4.3 kA.

According to the invention, the minimum triggering level can be varied over a broad range by selecting specific fuse types with regard to release current and characteristic. Another essential parameter is the number of windings, the surface of the winding, the core material for coil L2 and the specification of the resistor value R1 connected on the output side of the Graetz bridge G1.

The separated arrangement of the antenna circuit coil L1 and the pulsed current coil L2 according to FIG. 1 allows, in the different embodiments, the coupling of the discharge path for the pulsed current to the evaluation unit according to the invention.

In order not to be committed to a threshold of the impulse current i flowing in the conductor there is proposed, according to FIG. 2, a distribution of the energy generated by coil L2 to several switching elements, respectively, fuses S1.1 to S1.$x$ so as to allow an easy evaluation of the impulse current occurring in the conductor.

According to the illustration in FIG. 2 a node is formed on the output side of the Graetz rectifier bridge, downstream of the resistor R1, on which, in the example shown, three diodes D1.1, D1.2 and D1.$x$ are provided. A resistor R2.1, R2.2 and R2.$x$ is respectively connected in series to diodes D1.1, D1.2 and D1.$x$. Each resistor then leads to the fuse S1.1, S1.2 and S1.$x$ provided in each branch. An independent RFID circuit IC1.1, IC1.2 and IC1.$x$ is formed for each of the aforementioned fuses. Each RFID circuit includes an RFID coil L1.1, L1.2 and L1.$x$ with a corresponding antenna circuit capacitor C1.1, C1.2 and C1.$x$.

A parallel connection of fuses as switching devices with different release currents alone does not allow the setting of thresholds. The reason for this is the inverse proportionality between the release current and the resistance of a fuse. In order to realize the necessary threshold switches all fuses S1.$x$ are then configured with the same release current, the distribution of the release current being realized by resistors R2.1, R2.2 and 2.$x$. The lower the resistor value R2.$x$, the higher is the partial current flowing in this branch, so that the associated fuse is then triggered at the lowest threshold.

The response of the individual RFID circuits can be realized by the so-called AOR (Answer On Request) function which is offered by transponders available on the market. Alternatively, a different dimensioning of the carrier frequency for the different RFID circuits is conceivable.

The above-explained embodiments according to FIGS. 1 and 2 allow the nonrecurring registration of the exceedance of one or more threshold stages. A counting of events is impossible, however.

If one replaces the fuse by an electronic switch, configured as a self-conducting MOSFET T1, as is shown in FIG. 3, the antenna circuit of the transponder IC1 can be interrupted for a certain period. After a time which can be set by the time constant R2, C2 the antenna circuit is closed again.

If a continuous interrogation of the transponder IC1 is carried out by a reading device it is possible to realize a counting device for the occurrence of pulses, provided that the reading and evaluation unit works with an interrogation interval smaller than the time constant of the electronic switch T1. C2 and R2 are arranged as parallel circuits at the control input of the electronic switch T1.

The schematic circuit according to FIG. 3 allows a registration of the discharge current in an air-termination device of a lightning protection system. To this end, the pulse monitoring by an RFID transponder is accommodated in a housing which can be fixed to an air-termination device or a corresponding down conductor.

The orientation of the coil L2 is chosen such that magnetic field H (also see FIG. 4), caused by the impulse current i, penetrates the winding surface of the coil.

The winding surface of the RFID antenna circuit coil L1 is arranged such that preferably no induction is caused by the magnetic field H of the pulsed current.

A schematic arrangement of coils L1 and L2 of this type is illustrated in FIG. 4.

Here, the winding surface planes of coils L1 and L2 are substantially perpendicular to one another.

The magnetic field H penetrates the plane of the coil surface of coil L2 quasi perpendicularly, so that the induction is at a maximum.

The present passive RFID transponder is read out by means of an inductively coupled voltage y through L1 and a non-illustrated reading device.

This measure does not require electrical connections. Hence, the circuit for the pulse monitoring can be accommodated in a housing, hermetically sealed and weather-protected, which is a particular advantage for the arrangement on air-termination devices.

The evaluation and reading unit is accommodated separately, in a separate housing. Depending on the selected transmission method and the characteristics of the coil L1 it is possible to bridge defined distances. If RFID transponders having an AOR function are used the interrogation of several air-termination devices can be accomplished by a single evaluation unit.

SEQUENCE LISTING

Not Applicable

What is claimed is:

1. Circuit arrangement for the status check and logging of overvoltage protection devices or overvoltage protection systems by means of monitoring pulsed currents, comprising at least one RFID transponder having an inductively coupled voltage supply, wherein, in the event case of the overvoltage protection device or the overvoltage protection system, the RFID transponder antenna circuit is influenced, in particular interrupted, short-circuited or detuned so that interfering events are identifiable,
wherein
a down conductor of the overvoltage protection device or the overvoltage protection system, which carries occurring pulsed currents, is provided with a coil which is oriented such that the field induced by the pulsed currents penetrates the winding surface of the coil, wherein the coil (L2) is in communication with at least one switching device which is connected to the antenna circuit of the RFID transponder with the inductor (L1) provided there so as to periodically influence the antenna circuit.

2. Circuit arrangement according to claim 1,
wherein
the coil (L1) forming the inductor has an orientation which ensures that there is no induction or only little induction when pulsed currents occur.

3. Circuit arrangement according to claim 1,
wherein
the coil (L2) is connected to a Graetz rectifier bridge (G1) which is connected, on the output side, by a diode (D1) to the switching element or switching device (S1), wherein the switching element (S1) keeps the antenna circuit of the RFID transponder, comprising the coil (L1) and a capacitor (C1), closed in the initial state.

4. Circuit arrangement according to claim 3,
wherein
if the switching element (S1) is triggered, a half-wave of the voltage generated by the coil (L1) is blocked by the rectifier bridge (G1) and the diode (D1), so that the sensitivity of the RFID communication is influenced, in particular reduced.

5. Circuit arrangement according to claim 1,
wherein
the coil (L2) is configured as a toroidal core coil or as an air-cored coil, in particular a Rogowski coil.

6. Circuit arrangement according to claim 3,
wherein
several diodes (D1.1 to D1.x) are provided on the output side of the Graetz rectifier bridge (G1), each of which lead via a resistor (R2.1 to R2.x) to an associated switching element (S1.1 to S1.x), wherein minimum triggering levels for the associated switching elements (S1.1 to S1.x) can be predefined based on the values of the resistors (R2.1 to R2.x) so as to accomplish an evaluation of occurring pulsed currents or impulse currents and, to this end, each of the switching elements (S1.1 to S1.x) is in communication with an own RFID transponder (IC1.1 to IC1.x) and the respective antenna circuit thereof.

7. Circuit arrangement according to claim 1,
wherein
the switching elements or switching devices are configured as fuses.

8. Circuit arrangement according to claim 1,
wherein
the switching elements are configured as transistors (T), in particular MOSFETs, wherein a time constant can be set by means of an RC element arranged in the control branch of the respective transistor (T) in order to close the interrupted antenna circuit again or cancel the influence acting on the antenna circuit.

9. Circuit arrangement according to claim 1,
wherein
if the switching device is triggered it is possible to build up a communication connection by an increased coupling between a transponder reading device and the antenna circuit so as to read out information stored in the transponder.

10. Circuit arrangement according to claim 9,
wherein
the coupling can be enhanced by an increased transmitting power.

* * * * *